United States Patent [19]

Madan

[11] Patent Number: 5,629,228
[45] Date of Patent: May 13, 1997

[54] METHOD OF MAKING STACKED DRAM CAPACITOR STRUCTURE BY USING A CONFORMAL CONDUCTOR

[75] Inventor: Sudhir K. Madan, Dallas, Tex.

[73] Assignee: Texas Instruments Incorporated, Dallas, Tex.

[21] Appl. No.: 482,136

[22] Filed: Jun. 7, 1995

Related U.S. Application Data

[62] Division of Ser. No. 188,630, Jan. 27, 1994, which is a continuation of Ser. No. 919,345, Jul. 23, 1992, abandoned.

[51] Int. Cl.$^6$ .................................................. H01L 21/8242
[52] U.S. Cl. ........................................................ 438/397
[58] Field of Search ............................. 437/47, 60, 191, 437/193, 919

[56] References Cited

U.S. PATENT DOCUMENTS

| | | | |
|---|---|---|---|
| 4,742,018 | 5/1988 | Kimura et al. | 437/48 |
| 5,006,481 | 4/1991 | Chan et al. | 437/60 |
| 5,095,346 | 3/1992 | Bae et al. | 257/296 |
| 5,142,438 | 8/1992 | Reinbert et al. | 361/313 |
| 5,162,249 | 11/1992 | Kim | 437/191 |
| 5,164,337 | 11/1992 | Ogawa et al. | 437/228 |
| 5,208,176 | 5/1993 | Ahmad et al. | 437/47 |
| 5,235,199 | 8/1993 | Hamamoto et al. | 257/308 |

FOREIGN PATENT DOCUMENTS

| | | | |
|---|---|---|---|
| 56-58253 | 5/1981 | Japan | 257/308 |
| 62-286269 | 12/1987 | Japan | 257/308 |
| 4-25170 | 1/1992 | Japan | 257/308 |

OTHER PUBLICATIONS

"3-Dimensional Stacked Capacitor Cell for 16M and 64M DRAMS", Ema et al., International Electron Devices Meeting, Dec., 1988, pp. 592–595.

"Novel High Density, Stacked Capacitor MOS RAM", Koyanagi et al., International Electron Devices Meeting, Dec., 1978, pp. 348–351.

*Primary Examiner*—Chandra Chaudhari
*Attorney, Agent, or Firm*—Robby T. Holland; James C. Kesterson; Richard L. Donaldson

[57] ABSTRACT

A method of forming a microelectronic device is described comprising the steps of providing a substrate, forming a conductive region on the substrate, and forming an insulating layer on said conductive region and said substrate. The method further comprises the steps of forming a spacer layer on said insulating layer, removing selective portions of said spacer layer and said insulating layer to expose a selective area of said conductive region thereby forming a storage node contact window, and forming a first conductive layer on said spacer layer and within said storage node contact window wherein said first conductive layer is in electrical communication with said conductive region. A storage electrode is formed by removing selective portions of said first conductive layer, removing said spacer layer thereby exposing a bottom surface area of said first conductive layer, conformably depositing a second conductive layer encompassing and in electrical communication with said first conductive layer and overlying said insulating layer, and etching a portion of said second conductive layer thereby isolating said second conductive layer from surrounding circuit elements. The capacitor is completed by forming a dielectric layer over said storage electrode and forming a third conductive layer which acts as a plate electrode capacitively-coupled to said storage electrode through said dielectric layer. Other devices, systems and methods are also disclosed.

15 Claims, 3 Drawing Sheets

METHOD OF MAKING STACKED DRAM CAPACITOR STRUCTURE BY USING A CONFORMAL CONDUCTOR

This is a divisional of application Ser. No. 08/188,630 filed Jan. 27, 1994; which is a continuation of application Ser. No. 07/919,345 filed Jul. 23, 1992 now abandoned.

FIELD OF THE INVENTION

This invention generally relates to capacitors for semiconductor memory devices in general and more specifically a stacked capacitor structure and method of manufacturing.

BACKGROUND OF THE INVENTION

Without limiting the scope of the invention, its background is described in connection with a dynamic random access memory (DRAM), as an example.

Heretofore, in this field, DRAM memory cells have used planar capacitors for simplicity of manufacturing. As the capacity of devices using these cells has increased, the geometry of these memory cells has steadily decreased until planar structures have become difficult to use reliably. As the memory cell geometry has decreased, so has the capacitor size and storage capacitance. However, a decrease in storage capacitance leads to lowered signal-to-noise ratios and errors due to alpha particle hits.

Prior art attempts to overcome these problems have included trench capacitor cells in which a capacitor is formed in the sidewall of a trench formed in a semiconductor substrate. This structure also has associated difficulties in the process of forming deep, small feature trenches.

Another prior art capacitor cell is disclosed in a U.S. Pat. No. 4,742,018 by Kimura, et al. In accordance with the claims of this invention, a process for producing a DRAM cell having a stacked capacitor is disclosed. In the process disclosed therein, a MOSFET is formed having a gate electrode, a drain region, and a source region in a semiconductor substrate. The process further comprises the steps of forming a first conductor layer on the substrate electrically connected to the drain region and depositing a first insulator film on the first conductor layer except for a necessary portion. Further disclosed therein is the step of depositing a second conductor on the first insulator so that the second conductor layer is electrically connected to the first conductor layer. Subsequently, a portion of the second conductor is removed, except for a necessary portion. The first insulator is then removed and a second insulator film is formed on the first and second conductor layers. Finally, a third conductor layer is formed on said second insulator film. Difficulties with this method include having a separate mask for first and second conductor layers which can introduce alignment problems and adds process steps.

Yet another prior art capacitor cell is disclosed in an article in International Electronic Devices Meeting, 1988, pp. 592–595 by Ema, et al. In this article, Ema, et al., disclose a stacked memory cell in which the capacitor cell is three-dimension. This prior art stacked capacitor is composed of a poly-Si—$Si_3N_4$—poly-Si structure. A difficulty with this prior art capacitor cell, as well as in others including the Kimura embodiment relates to the minimum spacing between capacitor cells. In these known prior art embodiments the minimum spacing between capacitor cells can be no less than the minimum feature size of the lithographic process used.

SUMMARY OF THE INVENTION

The stacked capacitor structures provided herein possess a high capacitance, high density semiconductor structure which can be manufactured without the associated difficulties of trench capacitor structures while providing improved capacitance for a minimum feature lithography, improved topography, and reduced masking process steps relative to prior known stacked capacitor structures and methods.

As such, the structure provides for forming a microelectronic capacitor comprising the steps of providing a substrate, forming a conductive region on the substrate, and forming an insulating layer on the conductive region and the substrate. The method further comprises the steps of forming a spacer layer on the insulating layer, removing selective portions of the spacer layer and the insulating layer to expose a selective area of the conductive region thereby forming a storage node contact window, and forming a first conductive layer on the spacer layer and within the storage node contact window wherein the first conductive layer is in electrical communication with the conductive region. A storage electrode is formed by removing selective portions of the first conductive layer thereby isolating remaining portions of said first conductive layer from surrounding circuit elements and from each other, removing the spacer layer thereby exposing a bottom surface area of the first conductive layer, conformably depositing a second conductive layer encompassing and in electrical communication with the first conductive layer and overlying the insulating layer, and etching a portion of the second conductive layer thereby isolating a remaining portion of the second conductive layer from surrounding circuit elements. In the preferred embodiment the first conductive layer is used for patterning the second conducting layer. Furthermore, in the preferred embodiment the remaining portions of the first conductive layer are a minimum feature size from each other and from surrounding circuit elements to maximize the number of devices which may be placed on an integrated circuit, however the spacing between storage electrodes may be less than the minimum feature size because the deposition thickness of the second conductive layer subtracts from the spacing between the storage electrodes. Therefore, for a given minimum feature size, a larger storage electrode and hence capacitance may be effected. The capacitor is completed by forming a dielectric layer over the storage electrode consisting of first conductive layer and the second conductive layer and forming a third conductive layer which acts as a plate electrode capacitively-coupled to the storage electrode through the dielectric layer.

DETAILED DESCRIPTION OF PREFERRED EMBODIMENTS

Figure 1:
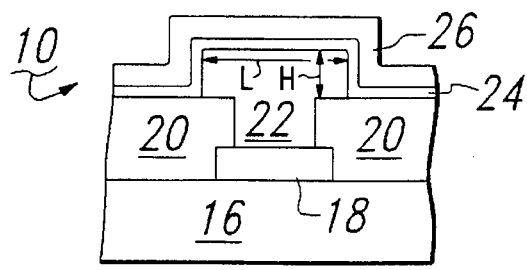
FIG. 1, in partial cross section, illustrates a microelectronic device formed in accordance with the prior art.

Referring now to the drawings in general and FIG. 1 in particular, the method of manufacturing prior art device 10 will be described. FIG. 1 shows, in partial cross section, a microelectronic circuit capacitor formed in accordance with the prior art. In the prior art, a substrate 16 is typically provided. This substrate 16 is typically formed of a monocrystalline silicon wafer. A contact pad 18 is now formed. This contact pad 18 may be polysilicon deposited on the substrate 16, or may be implanted into the substrate 16. Either method, or others, is well known in the art of semiconductor manufacturing. An insulating layer 20 is now formed over the substrate and over the contact pad 18. Insulating layer 20 is then typically patterned to remove insulating layer 20 in areas overlying the first electrode 18. A first electrode 22 is now formed over the exposed contact pad 18. The first electrode 22 is typically heavily doped polycrystalline silicon. A very thin dielectric 24 is now deposited over the surface of the first electrode 22. This dielectric 24 is made as thin as possible for maximum capacitance. The lower limit on dielectric thickness 24 will be determined by producibility and reliability concerns. Typically dielectric 24 will be an oxide/nitride/oxide (ONO) sandwich. A second electrode 26 is now formed over the dielectric 24. The second electrode 26 is typically heavily doped polycrystalline silicon. The second electrode 26 is typically a plate electrode which is common to all capacitor elements and connected to a single potential.

Figure 2A:
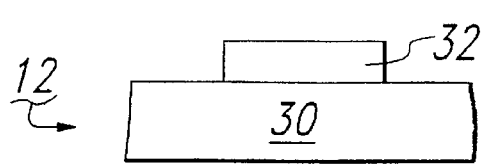
FIGS. 2a–2k, in partial cross section, illustrate progressive steps in the formation of a first preferred embodiment microelectronic device in accordance with the preferred embodiment of the present invention.

Referring now to FIGS. 2a-2k in general, the method of manufacturing the preferred embodiment of the present invention will now be described. A first preferred embodiment microelectronic device 12 is shown in FIG. 2a after a first stage in manufacturing. The microelectronic device 12 comprises a substrate 30 upon which pad electrodes 32 are formed. Typically this substrate 30 is monocrystalline silicon, although other materials could be used. By way of example, substrate 30 could be formed from, but not limited to, a list of materials including crystalline silicon, non-crystalline silicon, gallium arsenide, aluminum gallium arsenide, silicon-on-sapphire, and indium phosphide. Preferably, pad electrode 32 is a layer of polysilicon deposited, patterned, and etched over the substrate 30. Other possible compositions or methods for forming pad electrode 32 include selective dopant implantation into the substrate 30, metal deposition of one of many metals known in the art of semiconductor manufacturing such as aluminum, titanium, gold or tungsten, or metal deposition of a number of metal alloys well known in the art.

Figure 2B:
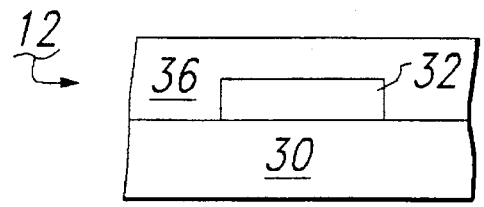

Referring now to FIG. 2b, an insulating layer, or interlevel oxide (ILO) 36 is formed overlying the microelectronic device 12 as was formed above in FIG. 2a. This ILO 36 serves to electronically insulate the substrate 30 and pad electrode 32 from undesired electrical contact to subsequently formed semiconductor elements. Typically ILO 36 is an oxide of thickness approximately 2000 Å to 8000 Å, however, the thickness is not critical and is determined by manufacturing considerations such as dielectric integrity, surface planarity, and time required to etch contacts to the substrate 30 or pad electrode 32. As an alternative to an oxide insulating layer or ILO 36, the insulating layer may be formed of a nitride. Example insulating layers 30 include, but are not limited to: silicon dioxide and silicon nitride.

Figure 2C:
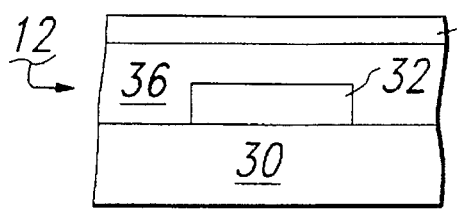

The partial cross section of microelectronic device 12 illustrated in FIG. 2c shows the structure of device 12 after a third processi an etch stop layer 38 is formed over the entirety of microelectronic device 12 as it existed subsequent to the processing of FIG. 2b. The purpose of this etch stop layer 38 is to form a barrier to semiconductor etching of subsequently formed layers. The composition of this etch stop layer 38 is dependent, therefore, upon the composition of these subsequently formed layers and the processes used to pattern/etch these subsequently formed layers. For example, if an oxide layer was to be formed overlying the etch stop layer 38, then the etch stop layer 38 could be formed from a nitride material. Etch processes which are selective to oxide over nitride, that is to say have a much higher rate of etching of oxide than nitride, are well known in the art of semiconductor manufacturing. Inversely, if a nitride layer was to be formed over the etch stop layer 38 an oxide could be used for etch stop 38 as processes selective to nitride over oxide are well known. Thickness of etch stop layer 38 will not be critical.

Figure 2D:
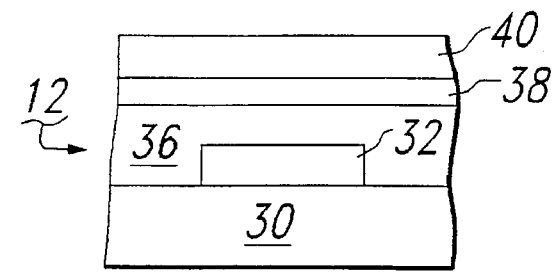

FIG. 2d illustrates the first preferred embodiment microelectronic device 12 after a fourth processing stage. In this figure, a spacer layer 40 is deposited over the etch stop 38. The thickness of this layer is important, as it ultimately will be a factor in determining the topography and capacitance of the final microelectronic device 12. This thickness shall be referred to as "S". Preferably, the thickness of spacer layer 40 will be approximately 2000 Å. The thickness of the spacer layer 40 will be varied according to the desired microelectronic device 12 capacitance and manufacturing constraints. Spacer layer 40 should be a material which can be removed by an etch selective to spacer layer 40 over etch stop layer 38. The spacer layer 40 should be capable of being etched in either the vertical, or the horizontal direction relative to the plane of the surface of substrate 30.

Figure 2E:
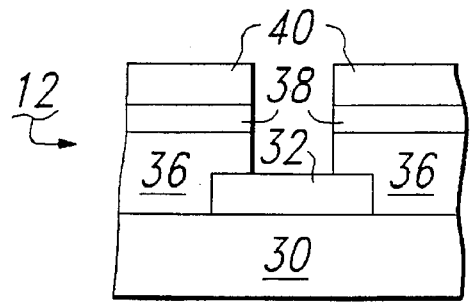

With reference to FIG. 2e, selected areas of, or a window in, spacer layer 40, etch stop layer 38, and insulating layer 36 are removed so as to expose pad electrode 32. Typically non-selected areas of the aforementioned elements are protected by an etch mask using techniques well known in the art of integrated circuit manufacturing. Removal of these layers may be accomplished by a single etch process having an acceptable etch rate to spacer layer 40, etch stop layer 38 and insulating layer 36 while having an insignificant etch rate relative to the etch mask. To minimize undercutting of the one material under its overlying layer the layers may be etched in sequence using an etch specific to each layer, with each etched layer acting as the mask for the next one. Ideally each etch will attack the desired layer at a useful rate and all of the other layers very slowly. Typically, the dimensions of the window will be a square of minimum feature size (F×F), although a circle or other shape could be used advantageously to reduce feature area.

Figure 2F:
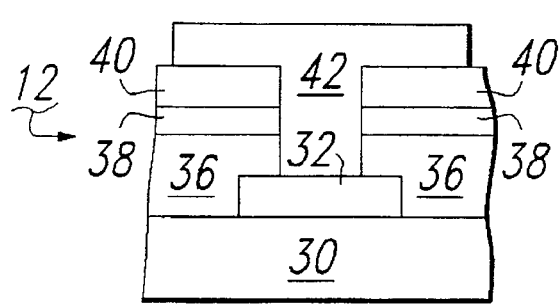

Referring now to FIG. 2f, a first conductive layer 42 is formed by depositing a layer of conductive material overlying the exposed pad electrode 32 within the selected removed regions of spacer layer 40, etch stop layer 38, and insulating layer 36. This first conductive layer 42 is then patterned and etched to remain above pad electrode 32. To maintain contact with pad electrode 32, first conductive layer 42 remains within the window in layers 36,38,40. The pattern of the remaining portion of this first conductive layer 42 which overlies the spacer layer 40 will typically be a rectangular solid and have dimensions of width (W), height (H), and length (L, not shown). These dimensions will provide a basis for the eventual capacitor area which of course is a factor in actual device capacitance. Obviously the remaining portion of first conductive layer 42 which overlies the spacer layer 40 may have shapes other than that of a rectangular solid.

Figure 2G:
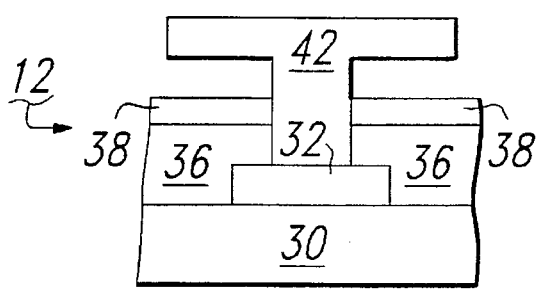

With reference to FIG. 2g, spacer layer 40 is removed, leaving the typical first conductive layer 42 as a sort of mushroom shape which has a rectangular top crown perched upon a square stem. Typically spacer 40 is an oxide and is removed by a hydrogen fluoride (HF) isotropic wet etch that is selective to the oxide spacer 40 over the storage poly 42 and over the etch stop layer 38 which is typically a nitride.

Figure 2H:
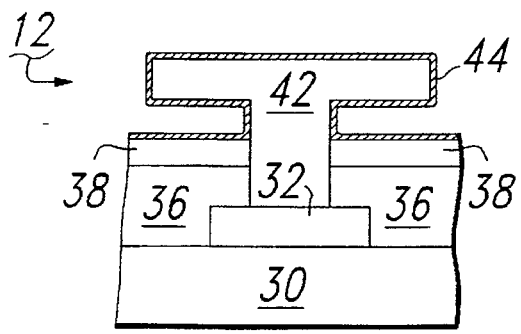
Figure 4:
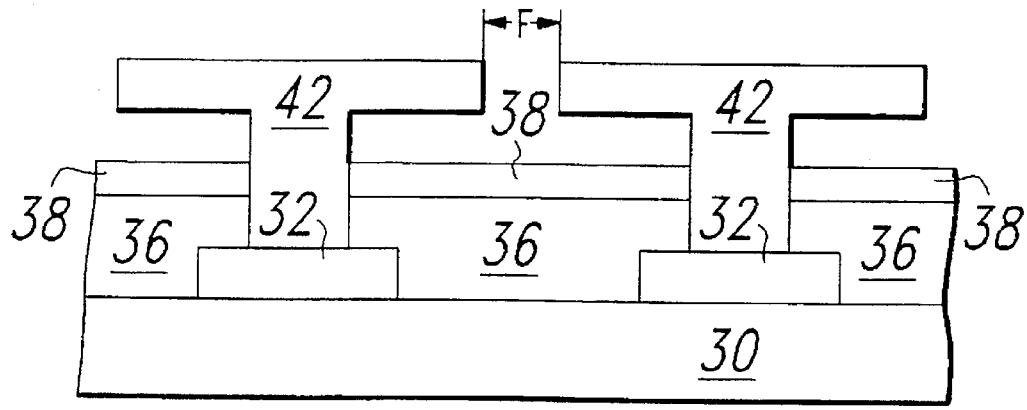
FIG. 4, in partial cross section, illustrates adjacent capacitors after the processing step described with respect FIG. 2g.
Figure 5:
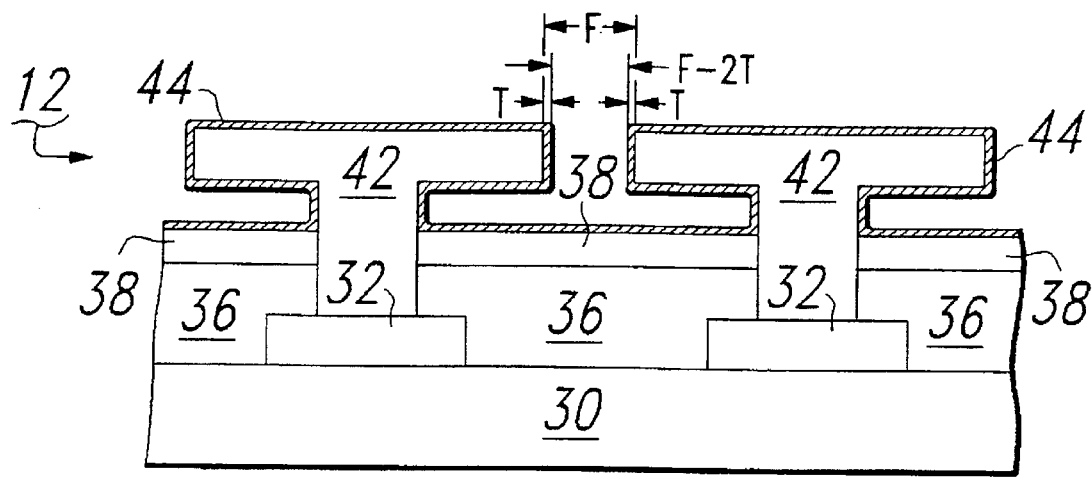
FIG. 5, in partial cross section, illustrates adjacent capacitors after the processing step described with respect to FIG. 2h.

With reference now to FIG. 2h, a conformal conductor 44 is deposited over the first conductive layer 42 and over the etch stop layer 38 to form a storage electrode comprising the first conductive layer 42 and the conformal conductor 44. Typically the conformal conductor 44 is conformal polysilicon. This conformal conductor 44 typically has a thickness, T, of about 500 Å and effectively increases the surface area of the first conductive layer 42. Specifically, conformal conductor 44 enlarges the depth of first conductive layer 42 by 2T, the depth (not shown) by 2T, and length by 2T. By using this conformal conductor 44 an increase in storage electrode area and therefore capacitance may be accomplished relative to prior art storage electrodes. Because the first conductive layer 42, as in the prior art storage electrodes, are limited in distance from neighboring circuit elements and from each other by minimum lithographic feature size F (as shown in FIG. 4), the capacitance and quantity of these elements in a given area are limited. However, by forming this conformal conductor 44 over the first conductive layer 42, the distance between neighboring circuit elements can be reduced to as little as F-2T (as shown in FIG. 5). In so doing, for a given lithographic feature size more elements can be put in a given area, or larger capacitance features can be used.

Figure 2I:
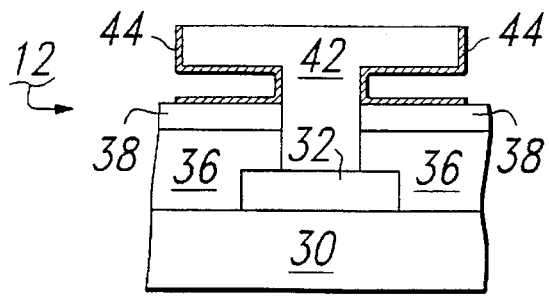

Referring now to FIG. 2i, the conformal conductor 44 is patterned and etched to provide isolation for each storage electrode from surrounding elements. As shown in FIG. 2i, an anisotropic etch is typically used to pattern conductor 44. This anisotropic etch is typically a reactive ion etch in which vertically travelling ions are bombarded upon the top surface of the device 12. As such, the conformal conductor 44 is removed from between the storage electrode 42 and other electrodes and from the top of storage electrode 42 (an unnecessary side-effect of the etch). Furthermore, conformal conductor 44 remains beneath and electrically connected to the crown of the storage electrode 42 and this conformal conductor 44 which remains over the layer 38 has effectively increased the surface area of the storage electrode.

Figure 2J:
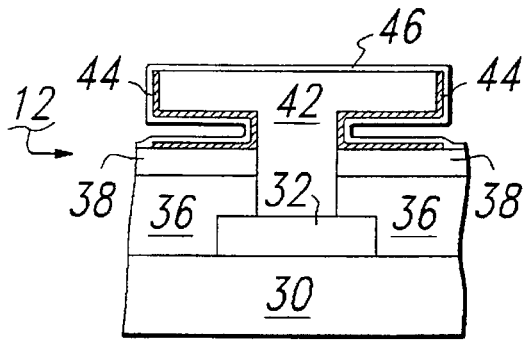

FIG. 2j illustrates the preferred embodiment microelectronic device 12 after yet another stage in manufacturing. This figure illustrates the device 12 as shown in FIG. 2i with a conformal dielectric layer 46 blanket deposited on the surface of the wafer. This dielectric layer 46 was chosen for its high dielectric constant and is ideally quite thin in order to maximize the capacitance which will be formed between the underlying storage electrode 42,44 and a subsequently deposited plate electrode 48 (not shown, see FIG. 2k). The dielectric layer 46 is typically a sandwich of nitride enclosed within two layers of oxide to form a tri-layer dielectric referred to as the ONO dielectric 46.

Figure 2K:
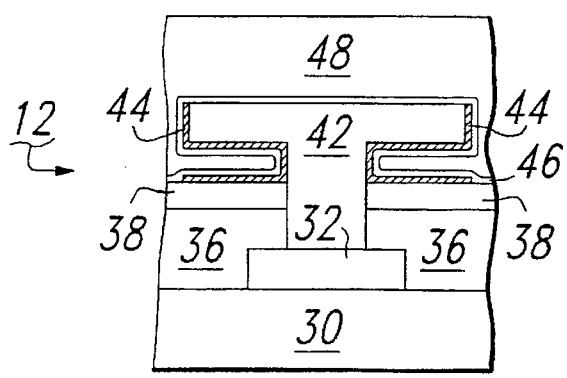

As shown in FIG. 2k, the capacitor 12 is completed by depositing a plate electrode 48 over the entire wafer surface and patterning it to leave it above and capacitively coupled to the storage electrodes 42. The capacitance of the device is determined by the area in which the ONO dielectric 46 is interposed between the storage electrode/conformal conductor 42,44 and the plate electrode 48.

Figure 3:
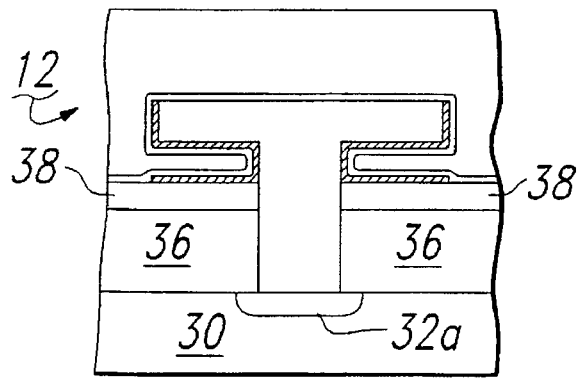
FIG. 3, in partial cross section, illustrates an alternative structure for forming the inventive microelectronic device.

FIG. 3, in partial cross section, illustrates an alternative structure for forming the inventive microelectronic device. As shown in FIG. 3, conducting region 32a may also be formed at substrate 30 by diffusion, ion implantation, or other techniques for adding impurities to a semiconductor material well known in the art of semiconductor manufacturing.

Preferably, substrate 30 is monocrystalline silicon, although other materials could be used. By way of example, substrate 30 could be formed from, but not limited to, a list of materials including crystalline silicon, non-crystalline silicon, gallium arsenide, aluminum gallium arsenide, silicon-on-sapphire, and indium phosphide. Preferably, pad electrode 32 is a layer of polysilicon deposited, patterned, and etched over the substrate 30. Other possible compositions or methods for forming pad electrode 32 include selective dopant implantation into the substrate 30, or metal deposition of one of many metals known in the art of semiconductor manufacturing such as aluminum, titanium, gold or tungsten, or metal deposition of a number of metal alloys well known in the art.

Preferably, ILO 36 an oxide, but other materials could be used. By way of example, ILO 36 could be formed from, but not limited to, a list of materials including phosphosilicate glass (PSG), borophosphosilicate glass (BPSG), silicon nitride, and silicon dioxide. Preferably, with use of oxide insulating layers, the etch stop layer 38 will be a nitride. The composition of the etch stop layer 38 is dependent, however, upon the composition of subsequently formed layers and the processes used to pattern/etch these subsequently formed layers. For example, if a nitride layer was to be formed over the etch stop layer 38 an oxide could be used for etch stop 38 as processes selective to nitride over oxide are well known. Thickness of etch stop layer 38 will not be critical.

Preferably spacer layer 40 is an oxide, but oxide layer 40 might in an alternative be polyimide or any number of materials from a list of materials such as used for ILO 36. First conductive layer 42 is ideally highly doped polycrystalline silicon, but a number of other conductive materials well known in the art might be used. Conformal layer 44 is typically polycrystalline silicon, but a number of other materials may also be used. For example, either conductive layer 42 or conformal layer 44 might be formed of silicided polysilicon such as tungsten silicide, molybdenum silicide, titanium-tungsten silicide, or a number of other materials.

Dielectric layer 46 is preferably an oxide/nitride/oxide tri-layer, but might be another oxide compound such as silicon dioxide or nitride compound such as silicon nitride. Another alternative dielectric layer is tantalum pentoxide.

Plate electrode 48 is typically highly doped polysilicon. Other potential materials include, but are not limited to: a silicide such as silicided polysilicon, tungsten silicide, molybdenum silicide, or titanium-tungsten silicide; a metal such as aluminum, an aluminum-tungsten bi-layer, tungsten or gold.

Possible etching processes include wet chemical, electrochemical, pure plasma etching, reactive ion etching (RIE), ion beam milling, sputtering and high-temperature vapor etching. Possible deposition process include sputter deposition, evaporation, ion beam deposition, chemical vapor deposition, plasma-enhanced chemical vapor deposition, and spin-on glass deposition.

The preferred embodiment of the present invention provides several advantages over prior art. One advantage over prior art devices is a very minimal number of photomasks for use in the pattern/etch steps of the preferred embodiment device and method for manufacturing. The preferred embodiment method requires only 2 photomasks. Depending on the etch used to form the contact window through insulator layer 36, etch stop layer 38, and spacer layer 40, it is possible to use only 2 pattern/etch/strip steps in manufacturing the capacitor of the preferred embodiment (one pattern/etch/strip of the contact window and one pattern/etch/strip of the first conductive layer to form the storage electrode). In prior art stacked capacitors such as those described by Kimura, et al. the storage electrodes are formed by depositing successive conductor/insulator pair layers. With each new conductor/insulator pair: an insulator is deposited, a contact hole must be patterned/etched in the insulator and a conductor must be deposited in the contact hole, the conductor must be patterned/etched. To form a similar structure to the preferred embodiment using a prior art structure and method would require the above described process for a single conductor/insulator pair layer, plus a preceding conductor deposit and pattern/etch. Totally, these three layers would require at least three photomasks (conductor photomask, contact hole photomask, and another conductor photomask) vs. the two photomasks used for the preferred embodiment.

Another advantage of the preferred embodiment is the use of the conformal conductor 44 as one layer of the stacked capacitor. The conformal conductor 44 may be deposited as a very thin layer, typically 500 Å, while prior art devices use thicker conductive layers for all layers of the stacked capacitor. The use of a very thin conductive layer for one layer of the stacked capacitor reduces topography in the preferred embodiment relative to prior art devices.

A further advantage of the preferred embodiment relative to the use of a conformal conductor 44 is the ability to reduce spacing between devices on the semiconductor substrate. By using the conformal conductor 44, the effective surface area of the storage electrode 42 is increased. These storage electrodes 42 may be placed a minimum spacing from each other as a function of lithography tolerances. If these electrodes 42 are placed at a minimum tolerance, the conformal conductor 44 when deposited increases the surface area of the storage electrode, while reducing the spacing between storage electrodes to below minimum lithographic feature size without causing problems with lithography. Because of this device capacitance can be increased over a prior art device having equal area such as those described by Kimura, supra and Ema, supra.

A few preferred embodiments have been described in detail hereinabove. It is to be understood that the scope of the invention also comprehends embodiments different from those described, yet within the scope of the claims. Words of inclusion are to be interpreted as nonexhaustive in considering the scope of the invention.

Implementation is contemplated in discrete components or fully integrated circuits in silicon, gallium arsenide, or other electronic materials families, as well as in optical-based or other technology-based forms and embodiments. It should be understood that various embodiments of the invention can employ or be embodied in hardware, software or microcoded firmware.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a microelectronic device, said method comprising the steps of:
   a) providing a substrate;
   b) forming a conductive region at said substrate;
   c) forming an insulating layer on said conductive region and said substrate;
   d) forming a spacer layer on said insulating layer;
   e) removing selective portions of said spacer layer and said insulating layer to expose a selective area of said conductive region thereby forming a storage node contact window;
   f) forming a first conductive layer on said spacer layer and within said storage node contact window wherein said first conductive layer is in electrical communication with said conductive region;
   g) removing selective portions of the said first conductive layer;
   h) removing said spacer layer thereby exposing a bottom surface area of said first conductive layer;
   i) conformably depositing a second conductive layer encompassing and in electrical communication with said first conductive layer and overlying said insulating layer;
   j) etching a portion of said second conductive layer thereby isolating a remaining portion of said second conductive layer from surrounding circuit elements and forming a storage electrode;
   k) forming a dielectric layer over said storage electrode; and
   l) forming a third conductive layer over said dielectric layer forming a plate electrode capacitively-coupled to said storage electrode through said dielectric layer.

2. The method of claim 1 and further comprising the step of depositing an etch stop layer subsequent to the depositing of said insulating layer and prior to the depositing of said spacer layer.

3. The method of claim 1 wherein said conducting region is formed by addition of impurities into said substrate.

4. The method of claim 1 wherein said conductive region is formed by deposition of highly doped polycrystalline silicon.

5. The method of claim 1 wherein said dielectric layer is a nitride.

6. The method of claim 1 wherein said dielectric layer is an oxide/nitride/oxide tri-layer.

7. The method of claim 1 wherein said dielectric layer is tantalum pentoxide.

8. The method of claim 1 wherein said selective portions of said spacer layer and selected portions of said insulating layer are removed in a two-step process.

9. A method of forming a microelectronic device, said method comprising the steps of:
   a) providing a substrate;
   b) implanting impurities in said substrate to form a conductive region therein;
   c) forming an insulating layer on said conductive region and on said substrate;
   d) forming a spacer layer on said insulating layer;
   e) removing selective portions of said spacer layer and said insulating layer to expose a selective area of said conductive region thereby forming a storage node contact window;
   f) depositing a first conductive layer on said spacer layer and within said storage node contact window such that said first conductive layer is in electrical communication with said conductive region;

g) removing selective portions of the said first conductive layer;

h) removing said spacer layer thereby exposing a bottom surface area of said first conductive layer;

i) conformably depositing a second conductive layer encompassing and in electrical communication with said first conductive layer and overlying said insulating layer;

j) etching a portion of said second conductive layer thereby isolating a remaining portion of said second conductive layer from surrounding circuit elements and forming a storage electrode;

k) forming an oxide/nitride dielectric layer over said storage electrode; and l) depositing a third conductive layer over said dielectric layer, thereby forming a plate electrode capacitively-coupled to said storage electrode through said dielectric layer.

10. The method of claim 9 and further comprising the step of depositing an etch stop layer subsequent to the depositing of said insulating layer and prior to the depositing of said spacer layer.

11. The method of claim 9 wherein said oxide/nitride layer is an oxide/nitride/oxide tri-layer.

12. The method of claim 9 wherein said selective portions of said spacer layer and selected portions of said insulating layer are removed in a two-step process.

13. The method of claim 9 wherein said spacer layer has a thickness of approximately 2000 angstroms.

14. The method of claim 9 wherein said second conductive layer has a thickness of about 500 angstroms.

15. The method of claim 1 wherein said second conductive layer has a thickness of about 500 angstroms.

* * * * *